United States Patent
Haga et al.

(10) Patent No.: US 6,536,735 B2
(45) Date of Patent: Mar. 25, 2003

(54) VIBRATION ISOLATING APPARATUS FOR TABLE FOR MOUNTING DEVICE SENSITIVE TO VIBRATIONS AND METHOD THEREFOR

(75) Inventors: Takahide Haga, Kanagawa (JP); Katsuhide Watanabe, Kanagawa (JP); Yoshinori Jouno, Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/971,666

(22) Filed: Oct. 9, 2001

(65) Prior Publication Data

US 2002/0074474 A1 Jun. 20, 2002

(30) Foreign Application Priority Data

Oct. 10, 2000 (JP) ....................... 2000-309330

(51) Int. Cl.[7] ............................................ F16M 13/00
(52) U.S. Cl. ........................ 248/550; 188/267; 248/638
(58) Field of Search ................................ 248/550, 637, 248/639, 638, 562, 636; 188/267; 73/662, 663; 267/136

(56) References Cited

U.S. PATENT DOCUMENTS

| | | | | |
|---|---|---|---|---|
| 4,892,273 A | | 1/1990 | Fedor | 244/158 R |
| 5,285,995 A | * | 2/1994 | Gonzalez et al. | 248/550 |
| 5,478,043 A | | 12/1995 | Wakui | 248/550 |
| 5,750,897 A | * | 5/1998 | Kato | 248/550 |
| 5,765,800 A | * | 6/1998 | Watanabe et al. | 248/550 |
| 6,021,991 A | * | 2/2000 | Mayama et al. | 188/267 |
| 6,213,442 B1 | * | 4/2001 | Ivers et al. | 248/550 |
| 6,213,443 B1 | * | 4/2001 | Wakui | 248/550 |

FOREIGN PATENT DOCUMENTS

| | | |
|---|---|---|
| EP | 0 627 573 | 12/1994 |
| EP | 0 748 951 | 12/1996 |
| GB | 2 165 667 | 4/1986 |
| GB | 2 299 867 | 10/1996 |
| WO | WO00/20775 | 4/2000 |

* cited by examiner

*Primary Examiner*—Anita King
*Assistant Examiner*—Tan Le
(74) *Attorney, Agent, or Firm*—Armstrong, Westerman & Hattori, LLP

(57) ABSTRACT

There are disclosed a vibration isolating apparatus and a vibration eliminating method imposed less restrictions on the positioning of components, such as active actuators, forming part of the vibration isolating apparatus. The vibration isolating apparatus can be implemented with a relatively simple controller (such as an analog circuit) and can limit the interference of control forces to a practically ignorable degree. The vibration isolating apparatus has a table for mounting thereon a device vulnerable to vibrations, a plurality of sensors 15–20 for detecting motions of the table and a plurality of active actuators 11–14 for controlling positions of the table. Processing and controlling means converts values measured by the respective sensors and control forces exerted by the respective active actuators to control and operating amounts for motions in a total of six degrees of freedom: one each for translation in the vertical direction and for rotation about the axis of the translation of the device vulnerable to vibrations, resiliently supported by the vibration isolating apparatus, or the table, and two each for translations on a horizontal plane and rotations about the axes of the translations. The conversion is performed on the assumption that the resilient supporting center matches the center of gravity, and based on the two-dimensional positional relationship between the resilient supporting center and the sensors and the active actuators.

5 Claims, 2 Drawing Sheets

VIBRATION ISOLATING APPARATUS FOR TABLE FOR MOUNTING DEVICE SENSITIVE TO VIBRATIONS AND METHOD THEREFOR

BACKGROUND OF THE INVENTION

The present invention relates to a vibration isolating apparatus, and more particularly, to a highly accurate vibration isolating apparatus for blocking vibrations from a floor on which a semiconductor manufacturing apparatus, an electronic microscope or the like is installed, and for controlling a vibrating force from such an apparatus which adversely affects the yield of products and measurement/observation accuracies.

Conventionally, a vibration isolating apparatus of the type mentioned above has relied on a discrete point control method using a set of active actuators for controlling motions of a table. This method, however, has a problem in that control forces of the active actuators interfere with one another to generate unintended vibrations.

While the above problem could be solved by a method that controls each of degrees of motion freedom which are prevented from interfering with one another, this method would require a high performance controller because of complicated calculations needed for the control, resulting in an increased cost.

Considering now an equation of motion about the center of gravity (an inertial system) only taking into account a rigid motion (having a total of six degrees of freedom consisting of two degrees of freedom for translations in the horizontal direction, one degree of freedom for translation in the vertical direction, and three degrees of freedom for rotation about the axes of the translations, which are hereinafter denoted by X, Y, Z, α, β and γ) for a vibration isolating apparatus which has installed on its table a device sensitive to vibrations and is resiliently supported at respective active actuator points, the equation of motion is expressed by the following equation (1):

$$M\ddot{X} + C\dot{X} + KX = F \quad (1)$$

$$M = diag[m\ m\ m\ I_\alpha\ I_\beta\ I_\gamma]$$

$$C = \begin{bmatrix} \sum_{i=1}^n c_{xi} & 0 & 0 & 0 & \sum_{i=1}^n (d_{zi} \cdot c_{xi}) & -\sum_{i=1}^n (d_{yi} \cdot c_{xi}) \\ 0 & \sum_{i=1}^n c_{yi} & 0 & -\sum_{i=1}^n (d_{zi} \cdot c_{yi}) & 0 & \sum_{i=1}^n (d_{xi} \cdot c_{yi}) \\ 0 & 0 & \sum_{i=1}^n c_{zi} & \sum_{i=1}^n (d_{yi} \cdot c_{zi}) & -\sum_{i=1}^n (d_{xi} \cdot c_{zi}) & 0 \\ 0 & -\sum_{i=1}^n (d_{zi} \cdot c_{yi}) & \sum_{i=1}^n (d_{yi} \cdot c_{zi}) & \sum_{i=1}^n (d_{zi}^2 \cdot c_{yi} + d_{yi}^2 \cdot c_{zi}) & -\sum_{i=1}^n (d_{xi} \cdot d_{yi} \cdot c_{zi}) & -\sum_{i=1}^n (d_{xi} \cdot d_{zi} \cdot c_{yi}) \\ \sum_{i=1}^n (d_{zi} \cdot c_{xi}) & 0 & -\sum_{i=1}^n (d_{xi} \cdot c_{zi}) & -\sum_{i=1}^n (d_{xi} \cdot d_{yi} \cdot c_{zi}) & \sum_{i=1}^n (d_{zi}^2 \cdot c_{xi} + d_{xi}^2 \cdot c_{zi}) & -\sum_{i=1}^n (d_{yi} \cdot d_{zi} \cdot c_{xi}) \\ -\sum_{i=1}^n (d_{yi} \cdot c_{xi}) & \sum_{i=1}^n (d_{xi} \cdot c_{yi}) & 0 & -\sum_{i=1}^n (d_{xi} \cdot d_{zi} \cdot c_{yi}) & -\sum_{i=1}^n (d_{yi} \cdot d_{zi} \cdot c_{xi}) & \sum_{i=1}^n (d_{yi}^2 \cdot c_{xi} + d_{xi}^2 \cdot c_{yi}) \end{bmatrix}$$

$$K = \begin{bmatrix} \sum_{i=1}^n k_{xi} & 0 & 0 & 0 & \sum_{i=1}^n (d_{zi} \cdot k_{xi}) & -\sum_{i=1}^n (d_{yi} \cdot k_{xi}) \\ 0 & \sum_{i=1}^n k_{yi} & 0 & -\sum_{i=1}^n (d_{zi} \cdot k_{yi}) & 0 & \sum_{i=1}^n (d_{xi} \cdot k_{yi}) \\ 0 & 0 & \sum_{i=1}^n k_{zi} & \sum_{i=1}^n (d_{yi} \cdot k_{zi}) & -\sum_{i=1}^n (d_{xi} \cdot k_{zi}) & 0 \\ 0 & -\sum_{i=1}^n (d_{zi} \cdot k_{yi}) & \sum_{i=1}^n (d_{yi} \cdot k_{zi}) & \sum_{i=1}^n (d_{zi}^2 \cdot k_{yi} + d_{yi}^2 \cdot k_{zi}) & -\sum_{i=1}^n (d_{xi} \cdot d_{yi} \cdot k_{zi}) & -\sum_{i=1}^n (d_{xi} \cdot d_{zi} \cdot k_{yi}) \\ \sum_{i=1}^n (d_{zi} \cdot k_{xi}) & 0 & -\sum_{i=1}^n (d_{xi} \cdot k_{zi}) & -\sum_{i=1}^n (d_{xi} \cdot d_{yi} \cdot k_{zi}) & \sum_{i=1}^n (d_{zi}^2 \cdot k_{xi} + d_{xi}^2 \cdot k_{zi}) & -\sum_{i=1}^n (d_{yi} \cdot d_{zi} \cdot k_{xi}) \\ -\sum_{i=1}^n (d_{yi} \cdot k_{xi}) & \sum_{i=1}^n (d_{xi} \cdot k_{yi}) & 0 & -\sum_{i=1}^n (d_{xi} \cdot d_{zi} \cdot k_{yi}) & -\sum_{i=1}^n (d_{yi} \cdot d_{zi} \cdot k_{xi}) & \sum_{i=1}^n (d_{yi}^2 \cdot k_{xi} + d_{xi}^2 \cdot k_{yi}) \end{bmatrix}$$

$$X = \begin{bmatrix} x \\ y \\ z \\ \alpha \\ \beta \\ \gamma \end{bmatrix} \quad F = \begin{bmatrix} f_x \\ f_y \\ f_z \\ f_\alpha \\ f_\beta \\ f_\gamma \end{bmatrix}$$

where m represents the overall mass of the table and device; I, moment of inertia about the center of gravity; c, an attenuation coefficient; k, a spring constant; x, y and z, relative displacements of the position of the center of gravity; α, β, γ, angular displacements of the center of gravity; d, the coordinate of a position with the center of gravity defined as the origin; and f, a force acting on the center of gravity. Also, suffixes x, y, z, $\alpha$, $\beta$ $\alpha\nu\delta$ $\gamma$ represent respective degrees of freedom; and i, each resilient supporting point, i.e., an identification number of an active actuator.

The existence of terms other than diagonal components in an attenuation matrix C and a rigid matrix K in the set of equation (1) causes complicated calculations in eliminating the interference.

SUMMARY OF THE INVENTION

The present invention has been made in view of the problem mentioned above, and it is an object of the invention to provide a vibration isolating apparatus and a control method therefor which are imposed less restrictions on the positioning of components forming part of the vibration isolating apparatus, such as active actuators, can be implemented by a relatively simple controller (for example, implemented by an analog circuit), and limit the interference of control forces to a practically ignorable degree.

For a vibration isolating apparatus having a common table, points at which the active actuators act their forces exist on substantially the same plane on which the active actuators can be relatively freely positioned. Here, when the active actuators are positioned such that the resilient supporting center thereof matches the Z-axis of the inertial system, the attenuation matrix C and rigid matrix K in the set of equation (1) are expressed as the following equation (2), wherein a vertical translational motion Z is independent of a rotational motion $\gamma$ about the axis:

ing center is made coincident with the Z-axis in the inertial system determined by a supposed center of gravity. Since terms caused by errors can be ignored as long as the Z-axis in the interial system substantially matches the Z-axis in the resilient system, the equation (2) can be assumed to be satisfied.

Further, a horizontal translational motion X, a rotational motion $\beta$ about the axis of the motion X, a horizontal translational motion Y, and a rotational motion $\alpha$ about the axis of the motion Y interfere with one and are coupled to one another, as they appear as non- diagonal components of the attenuation matrix C and rigid matrix K shown in the equation (2). However, no problem will arise in practice if such a coupled state can be detected by sensors, a control system is applied in consideration of the coupling of both matrices such that the respective active actuators operate in cooperation. In addition, the coupling as mentioned would not make it difficult to design a control system in consideration of the coupling.

Consequently, according to one aspect of the present invention, there is provided a vibration isolating apparatus for removing a vibration of a table on which a device sensitive to vibrations is mounted, said apparatus comprising:

sensor means for detecting three-dimensional motions of said table;

actuator means for holding said table in a predetermined position; and a calculating unit for converting three-dimensional detection outputs from said sensor means to activation $$C = \begin{bmatrix} \sum_{i=1}^{n} c_{xi} & 0 & 0 & 0 & \sum_{i=1}^{n} (d_{zi} \cdot c_{xi}) & 0 \\ 0 & \sum_{i=1}^{n} c_{yi} & 0 & -\sum_{i=1}^{n} (d_{zi} \cdot c_{yi}) & 0 & 0 \\ 0 & 0 & \sum_{i=1}^{n} c_{zi} & 0 & 0 & 0 \\ 0 & -\sum_{i=1}^{n} (d_{zi} \cdot c_{yi}) & 0 & \sum_{i=1}^{n} (d_{zi}^2 \cdot c_{yi} + d_{yi}^2 \cdot c_{zi}) & 0 & 0 \\ \sum_{i=1}^{n} (d_{zi} \cdot c_{xi}) & 0 & 0 & 0 & \sum_{i=1}^{n} (d_{zi}^2 \cdot c_{xi} + d_{xi}^2 \cdot c_{zi}) & 0 \\ 0 & 0 & 0 & 0 & 0 & \sum_{i=1}^{n} (d_{yi}^2 \cdot c_{xi} + d_{xi}^2 \cdot c_{yi}) \end{bmatrix}$$

$$K = \begin{bmatrix} \sum_{i=1}^{n} k_{xi} & 0 & 0 & 0 & \sum_{i=1}^{n} (d_{zi} \cdot k_{xi}) & 0 \\ 0 & \sum_{i=1}^{n} k_{yi} & 0 & -\sum_{i=1}^{n} (d_{zi} \cdot k_{yi}) & 0 & 0 \\ 0 & 0 & \sum_{i=1}^{n} k_{zi} & 0 & 0 & 0 \\ 0 & -\sum_{i=1}^{n} (d_{zi} \cdot k_{yi}) & 0 & \sum_{i=1}^{n} (d_{zi}^2 \cdot k_{yi} + d_{yi}^2 \cdot k_{zi}) & 0 & 0 \\ \sum_{i=1}^{n} (d_{zi} \cdot k_{xi}) & 0 & 0 & 0 & \sum_{i=1}^{n} (d_{zi}^2 \cdot k_{xi} + d_{xi}^2 \cdot k_{zi}) & 0 \\ 0 & 0 & 0 & 0 & 0 & \sum_{i=1}^{n} (d_{yi}^2 \cdot k_{xi} + d_{xi}^2 \cdot k_{yi}) \end{bmatrix} \quad (2)$$

Since it is difficult to exactly know the position of the center of gravity as a practical matter, the resilient support-signals for activating said actuator means on the assumption that the center of resilient support by said actuator means matches the center of gravity, said activation signals being applied to said actuator means.

Said calculating unit comprises:

a first conversion unit for converting detection outputs from said sensor means to a translational motion component representing a translational motion of said table and a rotational motion component representing a rotational motion of said table;

a second conversion unit for converting said translational motion component and said rotational motion component to a force required for removing vibrations of said table; and a third conversion unit for converting said force to an electric signal for actuating said actuator means.

According to another aspect of the present invention, said sensor means is disposed to detect a translational motion along a first axis vertical to said table, a tranlational motion along a second axis vertical to said first axis and parallel to said table, and a translational motion along a third axis vertical to said second axis and parallel to said table. Said calculating unit is operable to calculate tranlational motion components along said first to third axes and rotational motion components about said first to third axes on the basis of the detection output of said sensor means to produce activation signals from said translational motion components and said rotational motion components for activating said actuating means.

According to a further aspect of the present invention, said actuator means comprises actuators at least one of which is positioned in each of four quadrants partitioned by said second axis and said third axis. Said sensor means comprises at least three first sensors for detecting a translational motion along said first axis, at least two second sensors for detecting a translational motion along said second axis and at least one third sensor for detecting a translational motion along said third axis. Said calculating unit produces said activating signal so as to minimize a difference between forces generated by said actuators.

Said at least two second sensors have different detecting axes each other.

According to a yet further aspect of the present invention, said actuator means comprises:

at least one first actuator disposed on said second axis;

at least one second actuator disposed in either one of two quadrants of four quadrants partitioned by said second axis and said third axis, said two quadrants being opposite to said first actuator with respect to said third axis; and at least one third actuator disposed in the other of the two quadrants of the four quadrants, said two quadrants being opposite to said first actuator with respect to said third axis.

Said sensor means comprises:

at least three first sensors for detecting a translational motion along said first axis;

at least two second sensors for detecting a translational motion along said second axis; and at least one third sensor for detecting a translational motion along said third axis.

Said calculating unit produces said activating signal so as to minimize a difference between forces generated by said first to third actuators.

Said at least two second sensors have different detecting axes each other.

According to another aspect of the present invention, there is provided a method of eliminating vibrations from a table on which a device sensitive to vibrations is mounted, comprising the steps of:

providing sensor means for detecting a motion of said table;

providing actuator means for holding said table in a predetermined position;

converting the output of said sensor means to activation signals for activating said actuator means on the assumption that the center of resilient support by said actuator means matches the center of gravity, said activation signals being applied to said actuator means.

As described above, according to the present invention, values measured by the respective sensors are converted to operating amounts of actuators with respect to a total of six degrees of freedom consisting of one degree of freedom each for translation in the vertical direction and for rotation about the axis of the translation of a table resiliently supported by the vibration isolating apparatus, and two degrees of freedom each for translations on the horizontal plane and for rotations about the axes of the translations, on the assumption that the resilient supporting center matches the center of gravity, and based on the two-dimensional positional relationship between the resilient supporting center and the sensors and active actuators. As a result, the vibration isolating apparatus of the present invention can advantageously control each degree of motion freedom with a relatively simple controller such as an analog circuit. Also advantageously, the vibration isolating apparatus can prevent the control forces of the respective actuators from interfering with one another, and provide a high performance vibration isolating apparatus without increasing any cost.

The above and other objects and features of the present invention will be understood more fully from the consideration of the following description taken in connection with the accompanying drawings wherein one example is illustrated by way of example.

DETAILED DESCRIPTION OF THE INVENTION

Figure 1:
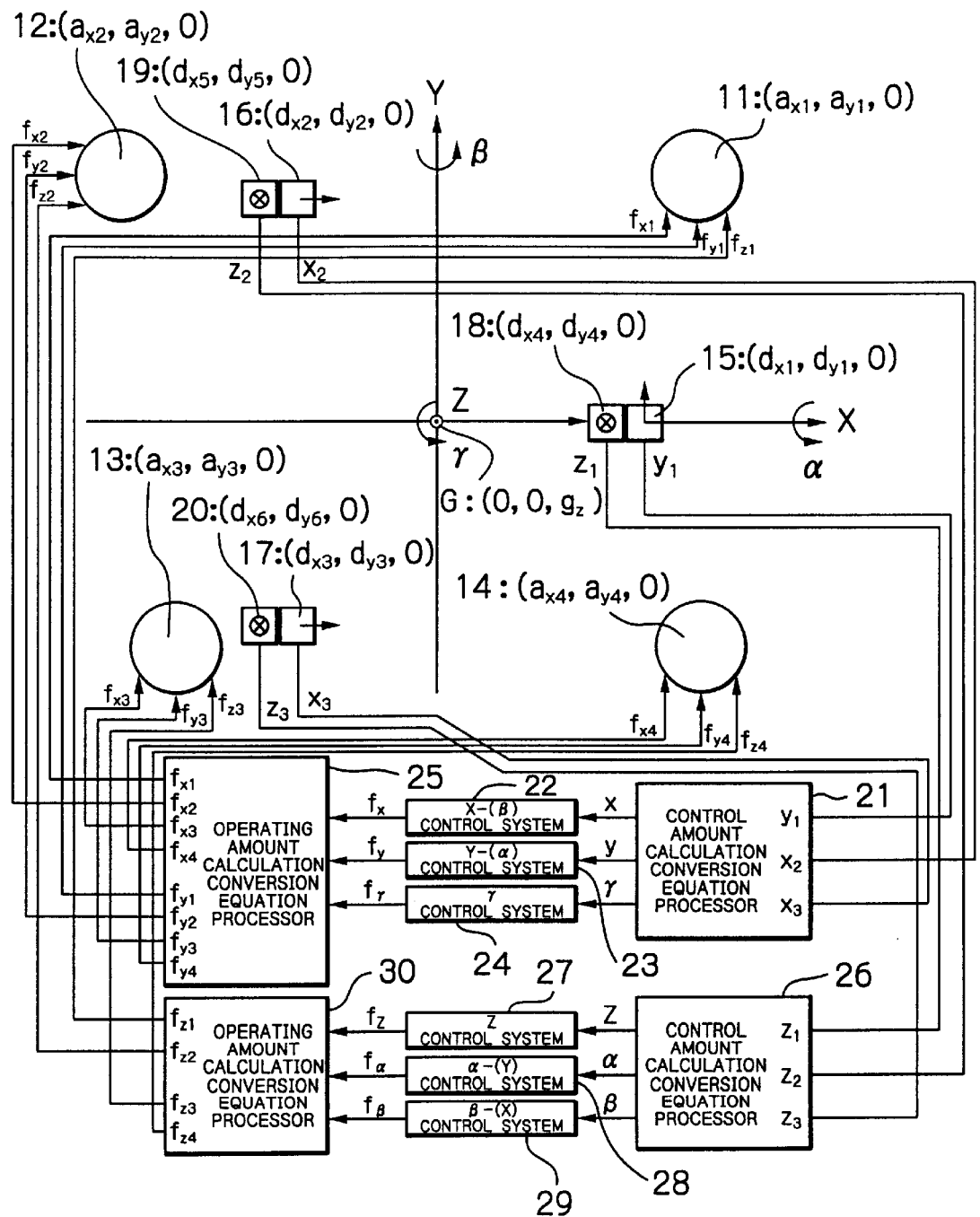
FIG. 1 schematically shows an embodiment of a vibration isolating apparatus according to the present invention and an exemplary arrangement of structural components thereof.

In the following, one embodiment of the present invention will be described with reference to the accompanying drawings. FIG. 1 illustrates exemplary arrangement of components which comprises a vibration isolating apparatus according to the present invention. Coordinate axes in the figure represent resilient main axes, and the center of gravity G is located on the Z-axis. The reference numerals 11–14 designate active actuators for controlling motions of a table (not shown) for mounting a device vulnerable to vibrations, respectively. Active actuators 11–14 are provided in four quadrants partitioned by the X-axis and Y-axis on the horizontal plane. Each of the active actuators exerts a force in a vertical translational direction or a horizontal translational direction, or in all of these directions.

Sensors 15–20 are provided for detecting motions of the table. Specifically, the sensor 15 detects a motion of the table in the Y-axis direction; sensors 16 and 17 motions of the table in the X-axis direction; and sensors 18, 19 and 20 motions of the table in the Z-axis direction. The sensors 19 and 20 for detecting motions in the Z-direction have the common X-coordinate, while the sensors 16 and 17 for detecting motions of the table in the X-axis direction do not have a common detecting axis.

The vibration isolating apparatus further comprises a control amount calculation conversion equation processor 21; an X-($\beta$) control system 22; a Y-($\alpha$) control system 23: a $\beta$ control system 24: and an operating amount calculation conversion equation processor 25: a control amount calculation conversion equation processor 26: a Z-control system 27: an $\alpha$-(Y) control system 28: a $\beta$-(X) control system 29; and an operating amount calculation conversion equation processor 30.

The control amount calculation conversion equation processor 21 calculates translational components x and y and a rotational component $\gamma$ from an output $y_1$ of the sensor 15, an output $x_2$ of the sensor 16, and an output $x_3$ of the sensor 17, and outputs the components x, y and $\gamma$ to the X-($\beta$) control system 22, Y-($\alpha$) control system 23, and $\gamma$ control system 24, respectively. These X-($\beta$) control system 22, Y-($\alpha$) control system 23 and $\gamma$ control system 24 output forces $f_x$, $f_y$ and $f_\gamma$ of respective degrees of freedom to the operating amount calculation conversion equation processor 25 which in turn converts the forces $f_x$, $f_y$ and $f_\gamma$ of respective degrees of freedom to forces $f_{x1}, f_{x2}, f_{x3}, f_{x4}, f_{y1}, f_{y2}, f_{y3}, f_{y4}$, in the translational directions exerted by actuators 11–14 for eliminating vibrations. Processor 25 then outputs activation signals, corresponding to the forces in the translational directions, to the respective active actuators 11, 12, 13 and 14.

The control amount calculation conversion equation processor 26 calculates a translational component z and rotational components $\alpha$ and $\beta$ from an output $z_1$ of the sensor 18, an output $z_2$ of the sensor 19, and an output $z_3$ of the sensor 20, and outputs these components to the Z-control system 27, $\alpha$-(Y) control system 28, and $\beta$-(X) control system 29, respectively. These Z-control system 27, $\alpha$-(Y) control system 28, and $\beta$-(X) control system 29 output forces $f_z, f_\alpha$ and $f_\beta$ of respective degrees of freedom to the operating amount calculation conversion equation processor 30 which in turn converts the forces $f_z$, $f_\alpha$ and $f_\beta$ of respective degrees of freedom to forces $f_{z1}, f_{z2}, f_{z3}$ and $f_{z4}$ in the translational directions exerted to the table by actuators 11–14 to eliminate vibrations. Processor 30 then outputs activation signals, corresponding to the forces in the translational directions, to the respective active actuators 11, 12, 13 and 14.

The foregoing equation (2) is satisfied when the components of the vibration isolating apparatus are arranged as illustrated in FIG. 1. In the following, assume that X, Y, Z, $\alpha$, $\beta$ and $\gamma$ represent six degrees of freedom on the assumption that the resilient supporting center matches the center of gravity, unless otherwise noted.

Figure 2:
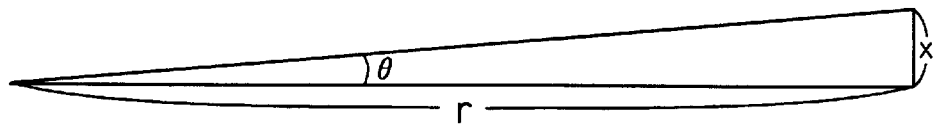
FIG. 2 shows a relationship between a rotating angle $\theta$ and a displacement X.

In the highly accurate vibration isolating apparatus, motions of the table detected by the sensors 15–20 are generally infinitesimal and sufficiently small as compared with the distance between the position of the resilient supporting center and the position at which each of the sensors 15–20 is disposed. Specifically, in FIG. 2 which shows the relationship between a rotating angle $\theta$ and a displacement x, r>>x stands ($\theta$ is infinitesimal), in which case the following equation (3) is satisfied:

$$\theta \approx \tan\theta = \frac{x}{r} \qquad (3)$$

Thus, the signals $x_i$, $y_i$ and $z_i$ output from the respective sensors mounted to be sensitive to the translational directions are represented by the translational components x, y and z, rotational components $\alpha$, $\beta$ and $\gamma$, and coordinate positions ($d_{xi}$, $d_{yi}$) as the following equation (4):

$$\left.\begin{aligned}
y_1 &= y + d_{x1} \cdot \gamma \\
x_2 &= x + d_{y2} \cdot \gamma \\
x_3 &= x + d_{y3} \cdot \gamma \\
z_1 &= z + d_{x4} \cdot \alpha + d_{y4} \cdot \beta \\
z_2 &= z + d_{x5} \cdot \alpha + d_{y5} \cdot \beta \\
z_3 &= z + d_{x6} \cdot \alpha + d_{y6} \cdot \beta
\end{aligned}\right\} \qquad (4)$$

By solving the simultaneous equation (4) for each of the degrees of freedom X, Y, Z, $\alpha$, $\beta$ and $\gamma$, a set of conversion equations is derived, wherein coefficients are determined from the coordinate positions of the respective sensors 15–20. In the example illustrated in FIG. 1, the sensors 15–20 are arranged under the condition expressed by the following equation (5) so that the simultaneous equation can be solved.

$$d_{y2} \ne d_{y3}, \ d_{x5} = d_{x6} \qquad (5)$$

A resulting conversion equation is represented by simple sum-of-products operations as shown in the following equation (6):

$$\left.\begin{aligned}
x &= \frac{-d_{y3}}{d_{y2}-d_{y3}} \cdot x_2 + \frac{d_{y2}}{d_{y2}-d_{y3}} \cdot x_3 \\
y &= y_1 + \frac{d_{x1}}{d_{y2}-d_{y3}} \cdot x_2 + \frac{-d_{x1}}{d_{y2}-d_{y3}} \cdot x_3 \\
z &= \frac{-d_{x5}}{d_{x4}-d_{x5}} \cdot z_1 + \frac{d_{x5} \cdot d_{y4} - d_{x4} \cdot d_{y6}}{(d_{x4}-d_{x5}) \cdot (d_{y5}-d_{y6})} \cdot z_2 + \\
&\quad \frac{d_{x4} \cdot d_{y5} - d_{x5} \cdot d_{y4}}{(d_{x4}-d_{x5}) \cdot (d_{y5}-d_{y6})} \cdot z_3 \\
\alpha &= \frac{1}{d_{y5}-d_{y6}} \cdot z_2 + \frac{-1}{d_{y5}-d_{y6}} \cdot z_3 \\
\beta &= \frac{-1}{d_{x4}-d_{x5}} \cdot z_1 + \frac{d_{y4}-d_{y6}}{(d_{x4}-d_{x5}) \cdot (d_{y5}-d_{y6})} \cdot z_2 + \\
&\quad \frac{d_{y5}-d_{y4}}{(d_{y4}-d_{x5}) \cdot (d_{y5}-d_{y6})} \cdot z_3 \\
\gamma &= \frac{-1}{d_{y2}-d_{y3}} \cdot x_2 + \frac{1}{d_{y2}-d_{y3}} \cdot x_3
\end{aligned}\right\} \qquad (6)$$

The control amount calculation conversion equation processors 21 and 26 calculate the equation (6) and applies calculated translational components x, y and z and rotational components $\alpha$, $\beta$ and $\gamma$ to the X-($\beta$) control system 22, Y-($\alpha$) control system 23, $\gamma$ control system 24, Z-control system 27, $\alpha$-(Y) control system 28, and $\beta$-(X) control system 29, designed in accordance with the respective degrees of freedom. As a result, the forces $f_x$, $f_y$, $f_\gamma$, $f_z$, $f_\alpha$ and $f_\beta$ in the degrees of freedom required for a vibration isolating operation, as described above, are then derived and converted to activation signals, corresponding to forces in the respective active actuators 11–14, in the operating amount calculation conversion equation processors 25 and 30.

Figure 3:
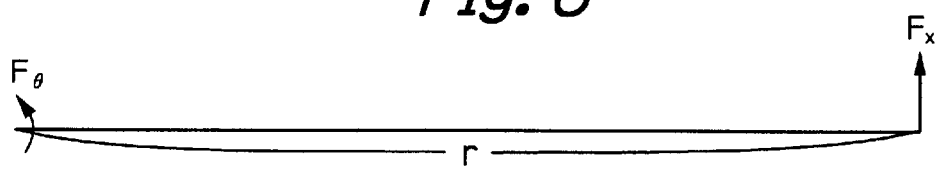
FIG. 3 shows a relationship between a moment and a force.

In the foregoing conversion, distribution coefficients are determined such that a combination of forces generated by the respective active actuators 11–14 is equal to a force in each degree of freedom without causing forces or moment of rotation in other degrees of freedom. Here, as illustrated in FIG. 3, a relationship between the moment of rotation $F_\theta$ and force F acting in the translational direction at a point spaced by a distance r from the center of rotation is represented by the following equation (7):

$$F_\theta = rF \tag{7}$$

Thus, the forces $f_x$, $f_y$, $f_z$, $f_\alpha$, $f_\beta$ and $f_\gamma$ in the respective degrees of freedom output from control system 22–29 are multiplied by distribution coefficients $k_{xi}$, $k_{yi}$, $k_{zi}$, $k_{\alpha i}$, $k_{\beta i}$ and $k_{\gamma i}$ that satisfy the following equation (8) and converted to forces $f_{xi}$, $f_{yi}$ and $f_{zi}$ in the translational directions to be exerted by four active actuators positioned at coordinates $(\alpha_{xi}, \alpha_{yi})$:

$$\left.\begin{array}{l}\sum_{i=1}^n k_{xi} = 1, \quad \sum_{i=1}^n k_{xi} \cdot a_{yi} = 0 \\[4pt] \sum_{i=1}^n k_{yi} = 1, \quad \sum_{i=1}^n k_{yi} \cdot a_{xi} = 0, \\[4pt] \sum_{i=1}^n k_{zi} = 1, \quad \sum_{i=1}^n k_{zi} \cdot a_{xi} = 0, \quad \sum_{i=1}^n k_{zi} \cdot a_{yi} = 0 \\[4pt] \sum_{i=1}^n k_{\alpha i} = 1, \quad \sum_{i=1}^n k_{\alpha i} \cdot \frac{a_{xi}}{a_{yi}} = 0, \quad \sum_{i=1}^n k_{\alpha i} \cdot \frac{1}{a_{yi}} = 0 \\[4pt] \sum_{i=1}^n k_{\beta i} = 1, \quad \sum_{i=1}^n k_{\beta i} \cdot \frac{a_{yi}}{a_{xi}} = 0, \quad \sum_{i=1}^n k_{\beta i} \cdot \frac{1}{a_{xi}} = 0 \\[4pt] \sum_{i=1}^n k_{\gamma i} = 1, \quad \sum_{i=1}^n k_{\gamma i} \cdot \frac{a_{yi}}{a_{xi}^2 + a_{yi}^2} = 0, \quad \sum_{i=1}^n k_{\gamma i} \cdot \frac{a_{xi}}{a_{xi}^2 + a_{yi}^2} = 0\end{array}\right\} \tag{8}$$

Those forces $f_{xi}$, $f_{yi}$ and $f_{zi}$ are represented by the following equation (9) which is likewise simple sum-of-products operations:

$$\left.\begin{array}{l}f_{x1} = k_{x1} \cdot f_x - k_{\gamma 1x} \cdot f_\gamma \\ f_{x2} = k_{x2} \cdot f_x - k_{\gamma 2x} \cdot f_\gamma \\ f_{x3} = k_{x3} \cdot f_x + k_{\gamma 3x} \cdot f_\gamma \\ f_{x4} = k_{x4} \cdot f_x + k_{\gamma 4x} \cdot f_\gamma \\ f_{y1} = k_{y1} \cdot f_y + k_{\gamma 1y} \cdot f_\gamma \\ f_{y2} = k_{y2} \cdot f_y - k_{\gamma 2y} \cdot f_\gamma \\ f_{y3} = k_{y3} \cdot f_y - k_{\gamma 3y} \cdot f_\gamma \\ f_{y4} = k_{y4} \cdot f_y + k_{\gamma 4y} \cdot f_\gamma \\ f_{z1} = k_{z1} \cdot f_z + k_{\alpha 1} \cdot f_\alpha - k_{\beta 1} \cdot f_\beta \\ f_{z2} = k_{z2} \cdot f_z + k_{\alpha 2} \cdot f_\alpha + k_{\beta 2} \cdot f_\beta \\ f_{z3} = k_{z3} \cdot f_z - k_{\gamma \alpha 3} \cdot f_\alpha + k_{\beta 3} \cdot f_\beta \\ f_{z4} = k_{z4} \cdot f_z - k_{\gamma \alpha 4} \cdot f_\alpha - k_{\beta 4} \cdot f_\beta\end{array}\right\} \text{where} \tag{9}$$

$$k_{\gamma ix} = \frac{a_{yi}}{a_{xi}^2 + a_{yi}^2} \cdot k_{\gamma i}, \quad k_{\gamma iy} = \frac{a_{xi}}{a_{xi}^2 + a_{yi}^2} \cdot k_{\gamma i} \tag{10}$$

It should be noted that in the embodiment shown in FIG. 1, the distribution coefficients are not uniquely determined only with the equation (8). It is necessary, therefore, to add a condition that the divergence of the distribution coefficients is minimized, to determine the distribution coefficients to minimize the differences between the forces generated by the respective active actuators and to avoid loading on a particular active actuator.

Figure 4:
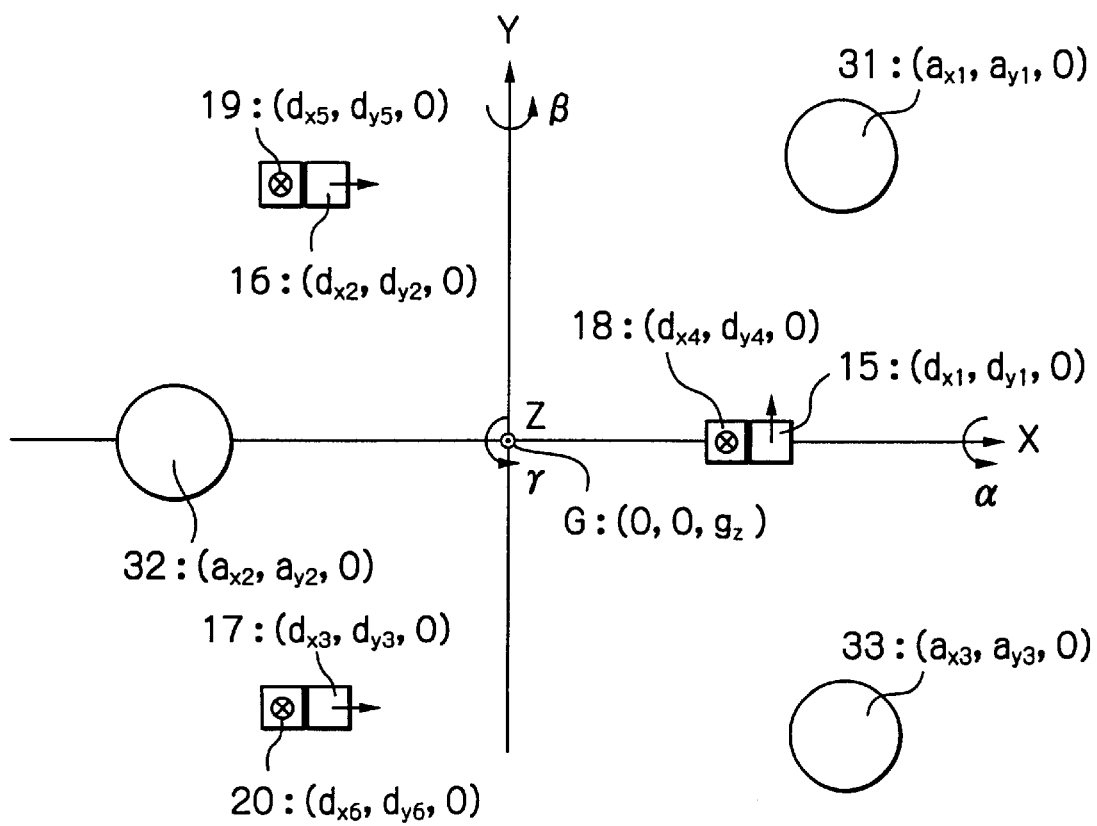
FIG. 4 illustrates another embodiment of a vibration isolating apparatus according to the present invention and an exemplary arrangement of structural components thereof.

FIG. 4 illustrates an exemplary arrangement of components of a vibration isolating apparatus according to another embodiment of the present invention. As illustrated in this embodiment, active actuators 31 and 33 are arranged in two of four quadrants partitioned by the X-axis and Y-axis on a horizontal plane, and one active actuator 32 is arranged on the boundary between the remaining two quadrants. The active actuators 31, 32 and 33 exert forces in the vertical translational directions or horizontal translational directions or in all the translational directions in order to eliminate vibrations of the table. In this case active actuators 31–33 distribute the forces in the translational directions such that mutual control forces do not affect other degrees of freedom in six degrees of freedom consisting of one degree of freedom for translation in the vertical direction on the horizontal plane, one degree of freedom for rotation about the axis (Z-axis) (rotational component γ), two degrees of freedom for translations on the horizontal plane, and two degrees of freedom for rotations (rotational components α, β) about the axes of the translations (X-axis, Y-axis). Since the control systems have substantially the same configuration as those of FIG. 1, description thereon is omitted here.

As described above, when a control system is constructed in consideration of two mutual interferences of X and β, and Y and a about the center of gravity under a relatively loose positioning condition which dictates that the active actuators are arranged on a certain plane such that the supposed center of gravity exists on the Z-axis which is the resilient main axis, it is possible to convert detection signals fed from the respective sensors to the forces generated by the active actuators by the set of conversion equations which are expressed by simple sum-of-products operations that are found on the assumption that the resilient supporting center matches the center of gravity.

What is claimed is:

1. A vibration isolating apparatus for removing a vibration of a table on which a device vulnerable to vibrations is mounted, said table being movable along anyone of a first axis, a second axis and a third axis, said second and third axes being orthogonal to said first axis, said apparatus comprising:

actuators for holding said table in a predetermined position, at least one of which is positioned in each of four quadrants partitioned by said second axis and said third axis;

at least three first sensors for detecting a translational motion along said first axis;

at least two second sensors for detecting a translational motion along said second axis;

at least one third sensor for detecting a translational motion along said third axis, and a calculating unit responsive to outputs from said first, second and third sensors to produce an activating signal so as to minimize a difference between forces generated by said actuators.

2. A vibration isolating apparatus for removing a vibration of a table on which a device sensitive to vibrations is mounted, said apparatus comprising:

sensor means for detecting three-dimensional motions of said table and outputting three-dimensional detection outputs;

actuator means for holding said table in a predetermined position in response to activation signals, said activation signals being applied to said actuator means; and a calculating unit for converting the three-dimensional detection outputs from said sensor means to the activation signals for activating said actuator means, on the assumption that the center of resilient support by said actuator means matches the center of gravity;

wherein said calculating unit comprises:

a first conversion unit for converting detection outputs from said sensor means to a translational motion component representing a translational motion of said table and a rotational motion component representing a rotational motion of said table;

a second conversion unit for converting said translational motion component and said rotational motion component to a force required for removing vibrations of said table; and a third conversion unit for converting said force to an electric signal for actuating said actuator means;

wherein said sensor means is disposed to detect a translational motion along a first axis vertical to said table, a translational motion along a second axis vertical to said first axis and parallel to said table, and a translational motion along a third axis vertical to said second axis and parallel to said table, and wherein said calculating unit is operable to calculate translational motion components along said first to third axes and rotational motion components about said first to third axes on the basis of the detection output of said sensor means to produce activation signals from said translational motion components and said rotational motion components for activating said actuating means; and wherein said actuator means comprises actuators at least one of which is positioned in each of four quadrants partitioned by said second axis and said third axis, wherein said sensor means comprises at least three first sensors for detecting a translational motion along said first axis, at least two second sensors for detecting a translational motion along said second axis and at least one third sensor for detecting a translational motion along said third axis, and wherein said calculating unit produces said activating signal so as to minimize a difference between forces generated by said actuators.

3. A vibration isolating apparatus according to claim 2, wherein said at least two second sensors have detecting axes different from each other.

4. A vibration isolating apparatus according to claim 2, wherein said actuator means comprises:

at least one first actuator disposed on said second axis;

at least one second actuator disposed in either one of two quadrants of four quadrants partitioned by said second axis and said third axis, said two quadrants being opposite to said first actuator with respect to said third axis; and at least one third actuator disposed in the other of the two quadrants of the four quadrants, said two quadrants being opposite to said first actuator with respect to said third axis, wherein said sensor means comprises:

at least three first sensors for detecting a translational motion along said first axis;

at least two second sensors for detecting a translational motion along said second axis; and at least one third sensor for detecting a translational motion along said third axis, and wherein said calculating unit produces said activating signal so as to minimize a difference between forces generated by said first to third actuators.

5. A vibration isolating apparatus according to claim 4, wherein said at least two second sensors have different detecting axes each other.

* * * * *